United States Patent
Tezuka

(10) Patent No.: US 10,547,309 B2
(45) Date of Patent: Jan. 28, 2020

(54) TOTEM-POLE CIRCUIT DRIVER

(71) Applicant: FUJI ELECTRIC CO., LTD., Kawasaki-shi, Kanagawa (JP)

(72) Inventor: Shinichi Tezuka, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/367,755

(22) Filed: Mar. 28, 2019

(65) Prior Publication Data
US 2019/0348982 A1 Nov. 14, 2019

(30) Foreign Application Priority Data
May 11, 2018 (JP) .................. 2018-091813

(51) Int. Cl.
| | | |
|---|---|---|
| *H03K 17/687* | (2006.01) | |
| *H03K 17/567* | (2006.01) | |
| *H02M 7/48* | (2007.01) | |
| *H01L 29/739* | (2006.01) | |

(52) U.S. Cl.
CPC ....... *H03K 17/687* (2013.01); *H01L 29/7393* (2013.01); *H02M 7/48* (2013.01); *H03K 17/567* (2013.01); *H03K 2217/0063* (2013.01)

(58) Field of Classification Search
None
See application file for complete search history.

(56) References Cited

U.S. PATENT DOCUMENTS

| | | | | |
|---|---|---|---|---|
| 9,443,966 | B2 * | 9/2016 | Yamaji | ............... H01L 29/7395 |
| 9,502,955 | B2 * | 11/2016 | Ohashi | .................. H02M 1/08 |
| 9,979,272 | B2 * | 5/2018 | Tezuka | ................ H03K 17/687 |
| 10,340,910 | B2 * | 7/2019 | Takida | .................... H03K 5/13 |
| 2014/0217466 | A1 | 8/2014 | Yamaji | |
| 2016/0036315 | A1 | 2/2016 | Ohashi et al. | |

FOREIGN PATENT DOCUMENTS

| | | |
|---|---|---|
| JP | 2005-304226 A | 10/2005 |
| JP | 6194959 B2 | 9/2017 |
| WO | WO-2013/069408 A1 | 5/2013 |

* cited by examiner

*Primary Examiner* — Jeffery S Zweizig
(74) *Attorney, Agent, or Firm* — Rabin & Berdo, P.C.

(57) ABSTRACT

A totem-pole circuit driver for driving cascade-connected high-side and low-side power devices. The driver includes a high-side drive circuit and a low-side drive circuit that respectively drive the high-side and low-side power devices, a pulse generation circuit which generates a set signal and a reset signal respectively upon detecting a first edge and a second edge of a high-side input logic signal, and generates a control signal from a low-side input logic signal, a high-side potential determination circuit which compares a high-side reference potential detected by a high-side potential detection circuit and a reference voltage, and an event signal generation circuit which outputs an event signal in accordance with the comparison. Upon receiving the event signal, and upon detecting that the high-side input logic signal instructs to turn off the high-side power device, the pulse generation circuit stops outputting the control signal for a period of time.

5 Claims, 6 Drawing Sheets

TOTEM-POLE CIRCUIT DRIVER

CROSS-REFERENCE TO RELATED APPLICATION

This application is based upon and claims the benefit of priority of the prior Japanese Patent Application No. 2018-091813, filed on May 11, 2018, the entire contents of which are incorporated herein by reference.

BACKGROUND OF THE INVENTION

1. Field of the Invention

The embodiment discussed herein is related to a totem-pole circuit driver for driving a totem-pole circuit including two power devices cascade-connected.

2. Background of the Related Art

With switching power supply apparatus the following circuit structure is adopted. A totem-pole circuit having two power devices cascade-connected is included. A high-side power device and a low-side power device of the totem-pole circuit are driven by drive circuits which are independent of each other. A high voltage integrated circuit (HVIC) is known as an apparatus having such a circuit structure.

An HVIC includes a pulse generation circuit which generates a signal used for turning on or off the high-side power device, a level shift circuit, and a high-side drive circuit which drives the high-side power device by the signal transmitted via the level shift circuit. Furthermore, the HVIC includes a low-side drive circuit which drives the low-side power device. The level shift circuit level-shifts the signal generated by the pulse generation circuit with a ground potential as reference and transmits it to the high-side drive circuit located on the high side. A signal whose amplitude changes between the ground potential and the high-side power source potential of the HVIC according to a change in input signal is generated by the level shift circuit. The high-side drive circuit accepts a voltage having such an amplitude and on-off drives the high-side power device.

On the other hand, a signal for turning on or off the low-side power device is generated with the ground potential as reference. Therefore, the signal is inputted directly to the low-side drive circuit without being level-shifted.

An output terminal of the totem-pole circuit, that is to say, the connection point of the low-side power device and the high-side power device is connected to a load. As a result, external noise caused by the load and a parasitic inductance may be superimposed at the output terminal of the totem-pole circuit. At this time a potential at the output terminal of the totem-pole circuit goes into an overshooting state or an undershooting state. That is to say, a potential at the output terminal of the totem-pole circuit becomes higher than or equal to a high-voltage potential of the high-side power device or becomes lower than or equal to the ground potential.

When a potential at the output terminal of the totem-pole circuit becomes lower than the ground potential, a signal may be outputted from the pulse generation circuit. In that case, the level shift circuit does not normally transmit the signal to the high-side drive circuit. As a result, the high-side power device does not turn off at the timing at which it needs to turn off, and remains on. Alternatively, the high-side power device does not turn on at the timing at which it needs to turn on, and remains off. That is to say, the original switching function is not maintained. In particular, when the high-side power device and the low-side power device turn on at the same time due to a failure of the switching function, a through current flows.

A technique for reliably avoiding malfunction of a level shift circuit caused by a signal for driving a high-side power device not being transmitted normally was proposed (see, for example, Japanese Patent No. 6194959). According to the technique described in Japanese Patent No. 6194959, for example, a potential at an output terminal of a totem-pole circuit, that is to say, a high-side reference potential on the high side is detected and whether there is a change in potential that impedes the transmission of a signal used for driving the power device is determined. If the determination that there is a change in potential which impedes the transmission of a signal used for driving the power device is made, then a pulse generation circuit is requested to generate again a signal used for driving the power device. By generating again the signal used for driving the power device, the signal is reliably transmitted to a high-side drive circuit.

Furthermore, the following technique was proposed in order to prevent a high-side power device and a low-side power device from turning on at the same time. After confirming that one of the high-side power device and the low-side power device is turned off, the other is turned on (see, for example, Japanese Laid-open Patent Publication No. 2005-304226 (FIG. 5)). According to the technique disclosed in, for example, Japanese Laid-open Patent Publication No. 2005-304226, an off signal supplied to one of the high-side power device and the low-side power device is detected and the on operation of the other power device is made valid. At this time an on signal of the high-side power device supplied from an upper apparatus is level-shifted after an off signal supplied to the low-side power device becomes valid. As a result, the high-side power device is put into an on state after the low-side power device is turned off. On the other hand, in order to make an on signal of the low-side power device supplied from the upper apparatus valid, a signal obtained by level-shifting and delaying an off signal supplied to the high-side power device and a potential at an output terminal of a totem-pole circuit are used. That is to say, after confirming that the signal obtained by level-shifting and delaying the off signal supplied to the high-side power device or the potential at the output terminal of the totem-pole circuit becomes a low level, the low-side power device is put into an on state. Accordingly, a level shift circuit which levels down the off signal supplied to the high-side power device, a delay circuit, and a NAND circuit are used.

With the technique disclosed in, for example, Japanese Laid-open Patent Publication No. 2005-304226 for avoiding a through current, however, a measure for malfunction caused by noise described in, for example, Japanese Patent No. 6194959 is not taken into consideration. Accordingly, simply adding a noise countermeasure circuit to the technique disclosed in, for example, Japanese Laid-open Patent Publication No. 2005-304226 makes the scale of a drive circuit too large because a level shift circuit, a delay circuit, and a NAND circuit are also added.

SUMMARY OF THE INVENTION

According to an aspect, there is provided a totem-pole circuit driver for driving a totem-pole circuit including a high-side power device and a low-side power device cascade-connected. The totem-pole circuit driver includes a high-side drive circuit which drives the high-side power device; a low-side drive circuit which drives the low-side power device; a pulse generation circuit which generates a set signal used for turning on the high-side power device on a basis of a first edge of a high-side input logic signal inputted from an outside and a reset signal used for turning off the high-side power device on a basis of a second edge of the high-side input logic signal and which generates a control signal used for turning on and off the low-side power device from a low-side input logic signal inputted from the outside; a level shift circuit which transmits the set signal and the reset signal to the high-side drive circuit; a high-side potential detection circuit which detects a high-side reference potential; a high-side potential determination circuit which outputs a determination signal indicative of a result obtained by comparing a value of the high-side reference potential detected by the high-side potential detection circuit and a reference voltage; and an event signal generation circuit which outputs an event signal on the basis of the determination signal. Upon receipt of the event signal while the high-side input logic signal gives an instruction to turn off the high-side power device, the pulse generation circuit stops output of the control signal used for turning on the low-side power device for a determined time after the receipt of the event signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described in detail with reference to the accompanying drawings with a case where it is applied to a totem-pole circuit driver of a switching power supply apparatus as an example. Components in figures indicated by the same numerals are the same. Furthermore, in the following description the same numeral may be used for representing the name of a terminal and a voltage, a signal, or the like at the terminal.

Figure 1:
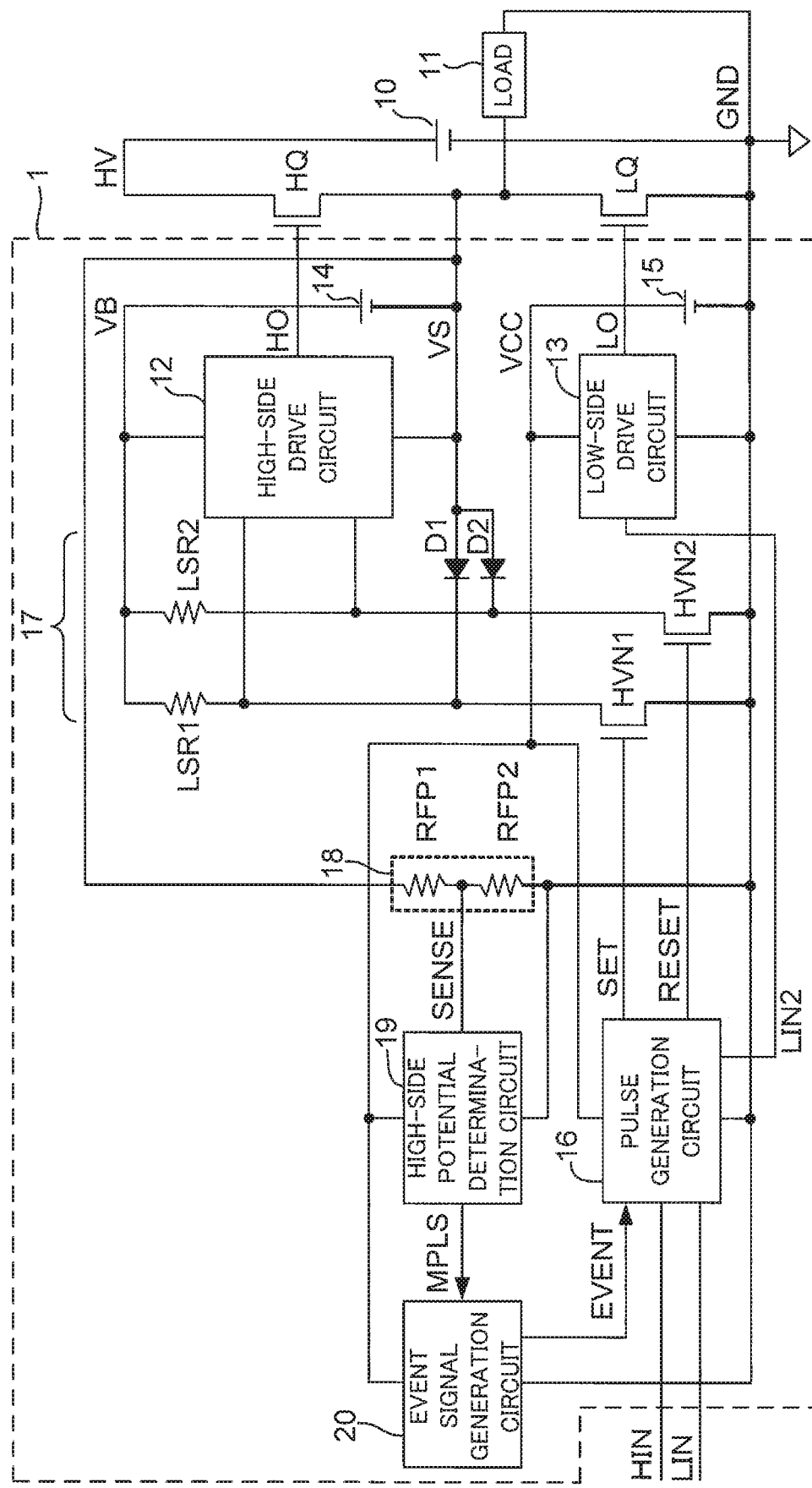
FIG. 1 is a circuit diagram illustrative of a switching power supply apparatus to which a totem-pole circuit driver according to an embodiment is applied.

FIG. 1 is a circuit diagram illustrative of a switching power supply apparatus to which a totem-pole circuit driver 1 according to an embodiment is applied.

As illustrated in FIG. 1, the switching power supply apparatus has a totem-pole circuit including a high-side power device HQ and a low-side power device LQ cascade-connected. In this embodiment, the high-side power device HQ and the low-side power device LQ are n-channel power MOS (metal-oxide-semiconductor) transistors. However, the high-side power device HQ and the low-side power device LQ may be other power devices such as insulated gate bipolar transistors (IGBTs).

A drain of the high-side power device HQ is connected to a positive electrode terminal of a high-voltage power source 10. A source of the low-side power device LQ and a negative electrode terminal of the high-voltage power source 10 are connected to ground GND. The source of the low-side power device LQ is connected directly to the ground GND. However, the source of the low-side power device LQ may be connected to the ground GND via a resistor. The connection point of a source of the high-side power device HQ and a drain of the low-side power device LQ, that is to say, an output terminal of the totem-pole circuit is connected to one terminal of a load 11. The other terminal of the load 11 is connected to the ground GND.

The totem-pole circuit is connected to the totem-pole circuit driver (HVIC) 1 including a high-side drive circuit 12 and a low-side drive circuit 13. That is to say, a gate of the high-side power device HQ is connected to an output terminal HO of the high-side drive circuit 12 and a gate of the low-side power device LQ is connected to an output terminal LO of the low-side drive circuit 13. A reference potential terminal of the high-side drive circuit 12 is connected to the output terminal of the totem-pole circuit and a negative electrode terminal of a high-side power source 14 and a power source terminal of the high-side drive circuit 12 is connected to a positive electrode terminal of the high-side power source 14. A reference potential terminal of the low-side drive circuit 13 is connected to the ground GND and a negative electrode terminal of a low-side power source 15 and a power source terminal of the low-side drive circuit 13 is connected to a positive electrode terminal of the low-side power source 15. A low-side power source potential is indicated by VCC with the ground GND as reference. A high-side reference potential and a high-side power source potential are indicated by VS and VB, respectively, with the ground GND as reference.

The totem-pole circuit driver 1 further includes a pulse generation circuit 16, a level shift circuit 17, a high-side potential detection circuit 18, a high-side potential determination circuit 19, and an event signal generation circuit 20.

The pulse generation circuit 16 receives from an upper apparatus (not illustrated) an input logic signal HIN for controlling the high side, receives from the upper apparatus (not illustrated) an input logic signal LIN for controlling the low side, and generates a high-side set signal SET, a high-side reset signal RESET, and a low-side control signal LIN2. Furthermore, a power source terminal of the pulse generation circuit 16 is connected to the positive electrode terminal of the low-side power source and a reference potential terminal of the pulse generation circuit 16 is connected to the ground GND and the negative electrode terminal of the low-side power source 15.

The level shift circuit 17 includes high breakdown voltage MOS transistors HVN1 and HVN2, resistors LSR1 and LSR2, and clamp diodes D1 and D2. A gate of the MOS transistor HVN1 is connected to a set signal output terminal of the pulse generation circuit 16 from which the set signal SET is outputted. A gate of the MOS transistor HVN2 is connected to a reset signal output terminal of the pulse generation circuit 16 from which the reset signal RESET is outputted. A drain of the MOS transistor HVN1 is connected to one terminal of the resistor LSR1 and the other terminal of the resistor LSR1 is connected to the power source terminal of the high-side drive circuit 12. A drain of the MOS transistor HVN2 is connected to one terminal of the resistor LSR2 and the other terminal of the resistor LSR2 is connected to the power source terminal of the high-side drive circuit 12. The connection point of the drain of the MOS transistor HVN1 and the resistor LSR1 is connected to an input terminal of the high-side drive circuit 12 and a cathode terminal of the diode D1. The connection point of the drain of the MOS transistor HVN2 and the resistor LSR2 is connected to an input terminal of the high-side drive circuit 12 and a cathode terminal of the diode D2. Anode terminals of the diodes D1 and D2 are connected to the output terminal of the totem-pole circuit. Sources of the MOS transistors HVN1 and HVN2 are connected to the ground GND.

The high-side potential detection circuit 18 detects the high-side reference potential VS. In this embodiment a resistive field plate (RFP) is used as a detection means. The resistant field plate is formed for the purpose of relaxing an electric field at a voltage withstand region high voltage junction terminal (HVJT) in a high withstand voltage region device of a high-side circuit (see, for example, International Publication No. WO2013/069408). With the high-side potential detection circuit 18 a branch point is provided in the resistant field plate to divide it into two resistors RFP1 and RFP2. One terminal of the resistant field plate is connected to the output terminal of the totem-pole circuit (high-side reference potential VS) and the other terminal of the resistant field plate is connected to the ground GND. The branch point of the resistant field plate is connected to an input terminal of the high-side potential determination circuit 19 and outputs a detection signal SENSE indicative of a change in the high-side reference potential VS.

The high-side potential determination circuit 19 receives the detection signal SENSE outputted by the high-side potential detection circuit 18 and outputs a signal MPLS for determining whether or not the high-side reference potential VS changes (high-side reference potential VS rises again, although the high-side power device HQ ought to have been turned off) by the influence of external noise. A power source terminal of the high-side potential determination circuit 19 is connected to the positive electrode terminal of the low-side power source 15 and a reference potential terminal of the high-side potential determination circuit 19 is connected to the ground GND and the negative electrode terminal of the low-side power source 15.

The event signal generation circuit 20 receives the signal MPLS outputted by the high-side potential determination circuit 19 and generates an event signal EVENT. The event signal EVENT generated is supplied to the pulse generation circuit 16. If the input logic signal HIN for controlling the high side is at an L level, then the pulse generation circuit 16 generates a low-side control signal LIN2 a determined time after an input of the event signal EVENT and supplies it to the low-side drive circuit 13. The determined time is set to a time which is almost the same as a dead time in normal operation. The dead time is a time from the time when one power device is turned off to the time when the other power device is turned on. The dead time is made long in advance to the extent that a through current does not flow, and is made short in advance to the extent that driving the load is not impeded.

It is assumed that at the time when the high-side power device HQ is turned off by the input logic signal HIN for controlling the high side, the high-side potential determination circuit 19 detects a fall in the high-side reference potential VS and outputs a high (H)-level signal MPLS. At this time the high-side drive circuit 12 may go due to noise or the like into an abnormal operating state in which it outputs an H-level signal. As a result, the high-side reference potential VS returns again to an H level. In that case, the signal MPLS changes to a low (L) level. The event signal generation circuit 20 receives the signal MPLS and outputs an event signal EVENT. If the input logic signal HIN for controlling the high side is at an L level, usually the signal MPLS is fixed at the H level and an event signal EVENT is not generated. However, if an event signal EVENT is outputted when the input logic signal HIN for controlling the high side is at the L level, then the pulse generation circuit 16 makes the timing at which the low-side power device LQ is turned on later than usual. That is to say, when the pulse generation circuit 16 receives the event signal EVENT, the pulse generation circuit 16 generates a reset signal RESET again and turns on the low-side power device LQ a determined time after generating the reset signal RESET again. Even if a reset signal RESET is not transmitted normally to the high-side drive circuit 12 due to the inclusion of noise, it is detected and a reset signal RESET is generated again in this way. This avoids a malfunction caused by noise or the like. Furthermore, if a reset signal RESET is generated again, then the low-side power device LQ is not turned on before the elapse of the determined time. This reliably prevents a through current from flowing.

Concrete examples of the pulse generation circuit 16, the high-side potential determination circuit 19, and the event signal generation circuit 20 and a concrete example of a rising edge trigger circuit used in the pulse generation circuit 16 and the event signal generation circuit 20 will now be described.

Figure 2:
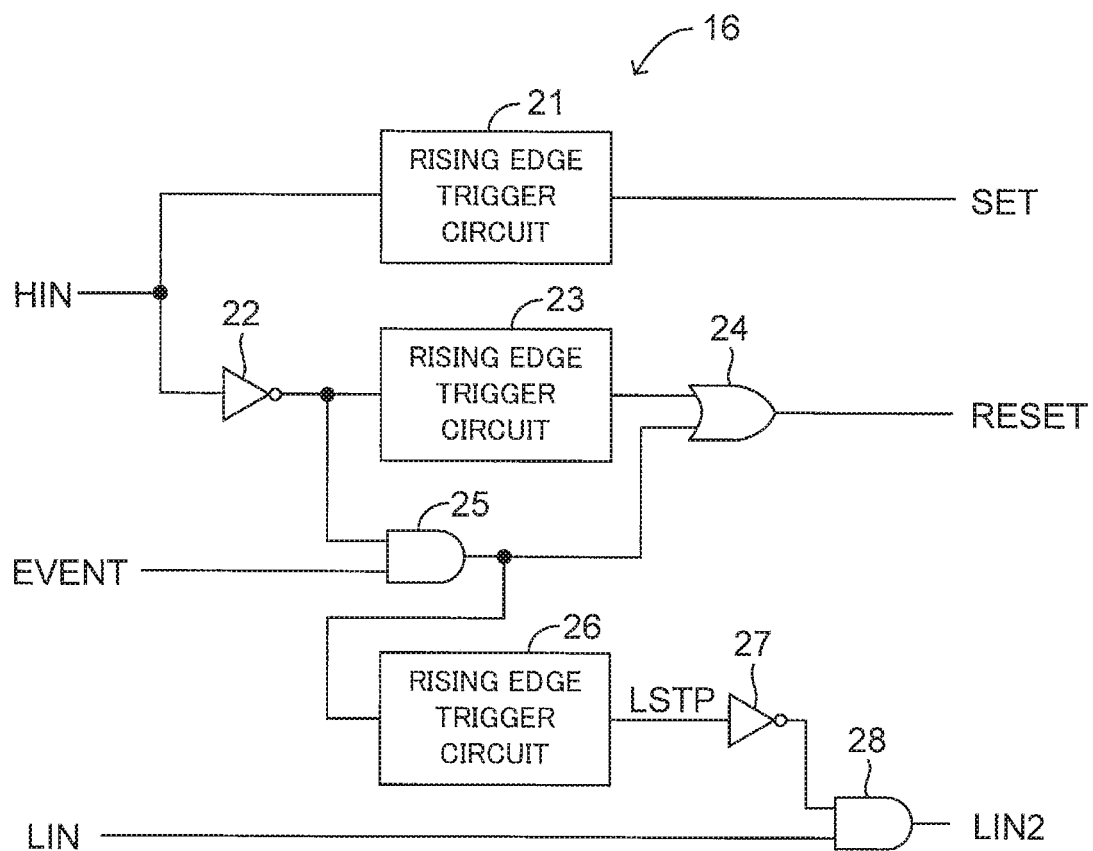
FIG. 2 is a circuit diagram illustrative of an example of a pulse generation circuit.
Figure 3:
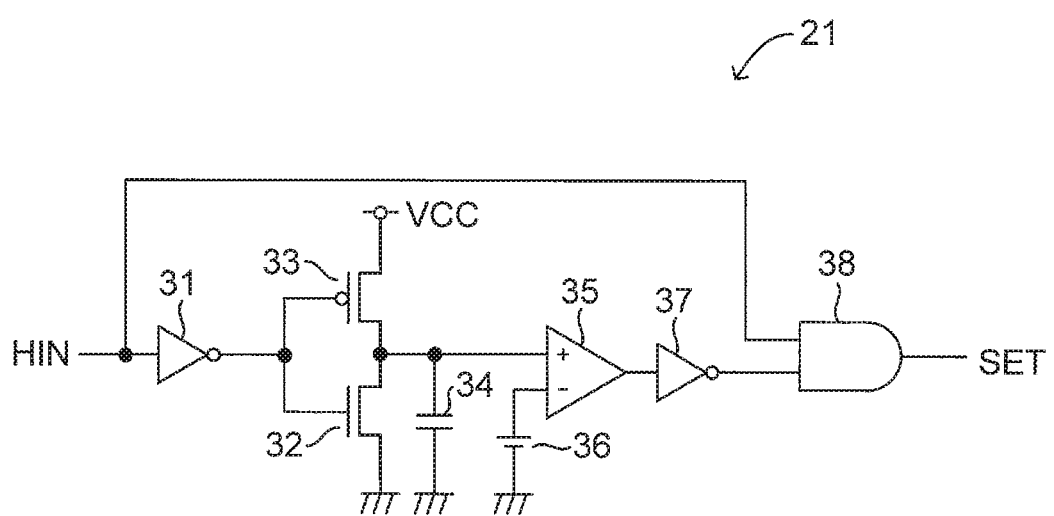
FIG. 3 is a circuit diagram illustrative of an example of a rising edge trigger circuit.
Figure 4:
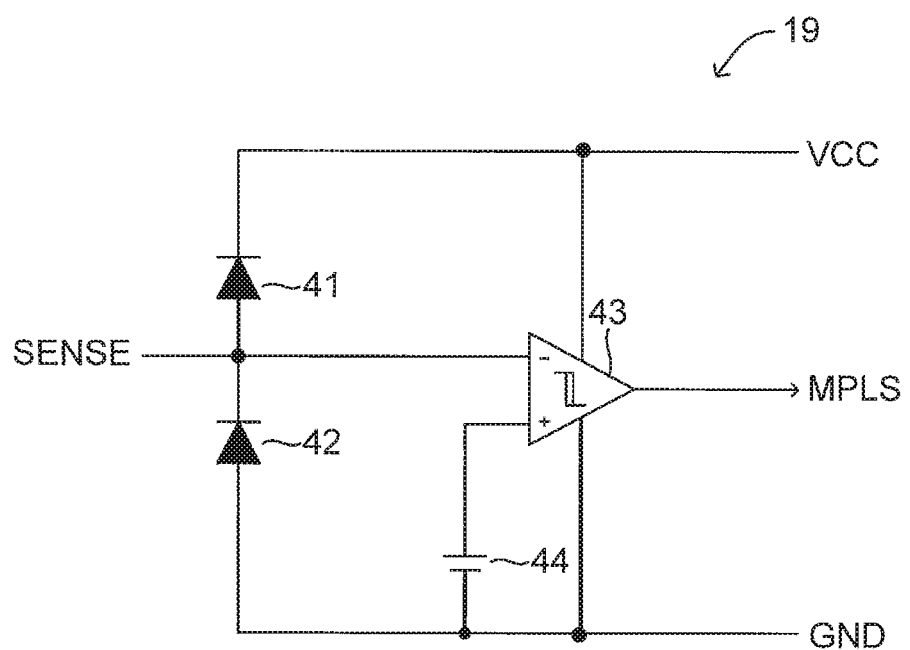
FIG. 4 is a circuit diagram illustrative of an example of a high-side potential determination circuit.
Figure 5:
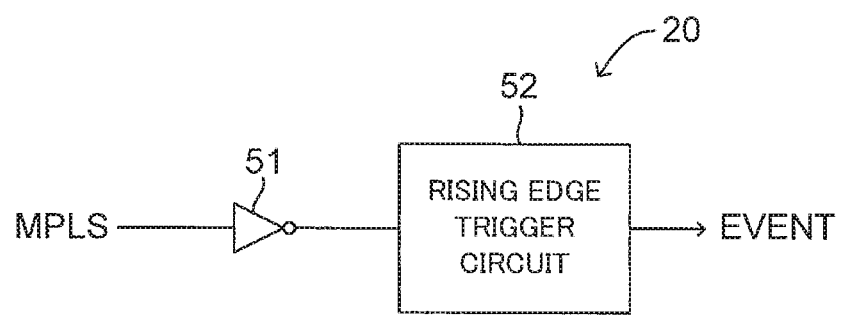
FIG. 5 is a circuit diagram illustrative of an example of an event signal generation circuit.
Figure 6:
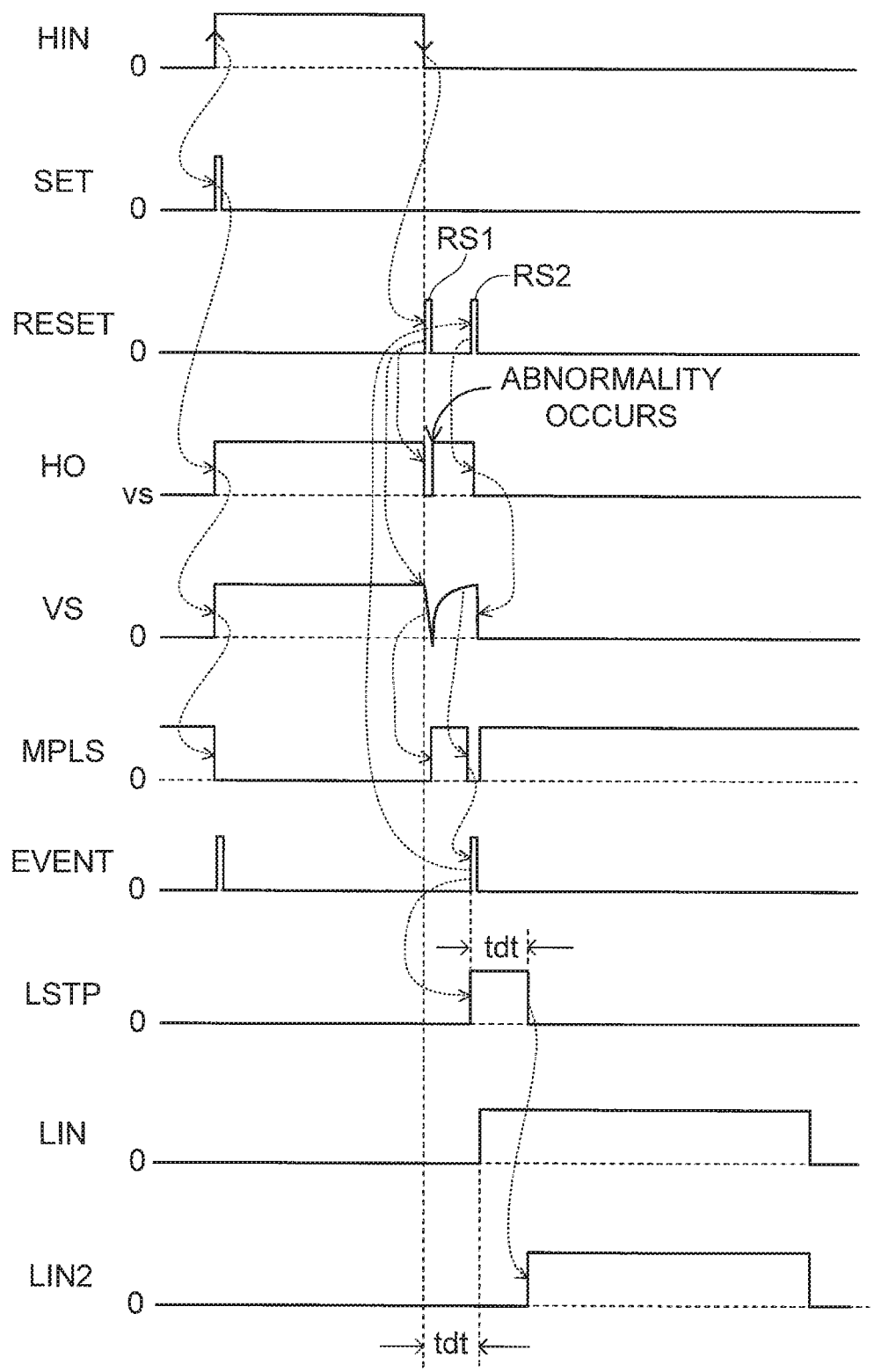
FIG. 6 is a timing chart illustrative of the operation of the totem-pole circuit driver.

FIG. 2 is a circuit diagram illustrative of an example of the pulse generation circuit. FIG. 3 is a circuit diagram illustrative of an example of the rising edge trigger circuit. FIG. 4 is a circuit diagram illustrative of an example of the high-side potential determination circuit. FIG. 5 is a circuit diagram illustrative of an example of the event signal generation circuit. FIG. 6 is a timing chart illustrative of the operation of the totem-pole circuit driver 1.

As illustrated in FIG. 2, the pulse generation circuit 16 has a HIN terminal, an EVENT terminal, and a LIN terminal as input terminals and has a SET terminal, a RESET terminal, and a LIN2 terminal as output terminals. The HIN terminal is connected to an input of a rising edge trigger circuit 21. An output of the rising edge trigger circuit 21 is connected to the SET terminal. Furthermore, the HIN terminal is connected to an input of an inverter 22. An output of the inverter 22 is connected to an input of a rising edge trigger circuit 23 and an output of the rising edge trigger circuit 23 is connected to one input of an OR circuit 24. An output of the OR circuit 24 is connected to the RESET terminal. Furthermore, the output of the inverter 22 is connected to one input of an AND circuit 25. The other input of the AND circuit 25 is connected to the EVENT terminal. An output of the AND circuit 25 is connected to the other input of the OR circuit 24. Furthermore, the output of the AND circuit 25 is connected to an input of a rising edge trigger circuit 26. An output of the rising edge trigger circuit 26 is connected to an input of an inverter 27. An output of the inverter 27 is connected to one input of an AND circuit 28 and the other input of the AND circuit 28 is connected to the LIN terminal. An output of the AND circuit 28 is connected to the LIN2 terminal.

The pulse generation circuit 16 includes the rising edge trigger circuits 21, 23, and 26 which are equal in structure.

Therefore, an example of the circuit structure of the rising edge trigger circuit 21 will now be described as a representative of them.

As illustrated in FIG. 3, the rising edge trigger circuit 21 has the HIN terminal from which an input logic signal HIN for controlling the high side is inputted. The HIN terminal is connected to an input of an inverter 31. An output of the inverter 31 is connected to gates of an nMOS transistor 32 and a pMOS transistor 33. A source of the nMOS transistor 32 is connected to the ground GND and a drain of the nMOS transistor 32 is connected to a drain of the pMOS transistor 33. A source of the pMOS transistor 33 is connected to the positive electrode terminal of the low-side power source 15 from which the low-side power source potential VCC is supplied. An output of a CMOS inverter circuit made up of the nMOS transistor 32 and the pMOS transistor 33 is connected to one end of a capacitor 34. The other end of the capacitor 34 is connected to the ground GND. Furthermore, the output of the CMOS inverter circuit is connected to a non-inverting input of a comparator 35. A positive electrode terminal of a reference voltage source 36 is connected to an inverting input of the comparator 35. A negative electrode terminal of the reference voltage source 36 is connected to the ground GND. An output of the comparator 35 is connected to an input of an inverter 37. An output of the inverter 37 is connected to one input of an AND circuit 38. The other input of the AND circuit 38 is connected to the HIN terminal. An output of the AND circuit 38 is connected to the SET terminal from which a set signal SET is outputted.

The rising edge trigger circuit 21 has been described. The rising edge trigger circuit 23 which generates a reset signal RESET has the same structure and the same circuit element constants. The rising edge trigger circuit 26 is equal in structure to the rising edge trigger circuits 21 and 23. However, the rising edge trigger circuit 26 differs from the rising edge trigger circuit 21 in the circuit element constant of the capacitor 34 or the reference voltage source 36. That is to say, the rising edge trigger circuits 21, 23, and 26 are equal in structure. Accordingly, the operation of the rising edge trigger circuit 23 or 26 will be described by reference to FIG. 3.

As illustrated in FIG. 4, the high-side potential determination circuit 19 has a SENSE terminal from which a detection signal SENSE outputted by the high-side potential detection circuit 18 is inputted. The SENSE terminal is connected to an anode of a protection diode 41, a cathode of a protection diode 42, and an inverting input of a comparator 43. A cathode of the protection diode 41 is connected to a VCC terminal. The VCC terminal is the positive electrode terminal of the low-side power source 15 from which the low-side power source potential VCC is supplied. An anode of the protection diode 42 is connected to the ground GND. A non-inverting input of the comparator is connected to a positive electrode terminal of a reference voltage source 44 and a negative electrode terminal of the reference voltage source 44 is connected to the ground GND. An output of the comparator 43 is connected to an MPLS terminal. Furthermore, a power source terminal of the comparator 43 is connected to the VCC terminal and a ground terminal of the comparator 43 is connected to a GND terminal. The reference voltage source 44 has two different voltages and the comparator 43 is a hysteresis comparator.

As illustrated in FIG. 5, the event signal generation circuit 20 has an MPLS terminal connected to the MPLS terminal of the high-side potential determination circuit 19. The MPLS terminal of the event signal generation circuit 20 is connected to an input of an inverter 51 and an output of the inverter 51 is connected to an input of the rising edge trigger circuit 52. An output of the rising edge trigger circuit 52 is connected to an EVENT terminal. The rising edge trigger circuit 52 is equal in circuit structure to the rising edge trigger circuit 21 illustrated in FIG. 3. Accordingly, the operation of the following rising edge trigger circuit 52 will be described by reference to FIG. 3.

The operation of the semiconductor device having the above structure will now be described by reference to the timing chart of FIG. 6.

First, at normal operation time the pulse generation circuit 16 outputs a set signal SET at the timing of the rising edge of an input logic signal HIN and outputs a reset signal RESET at the timing of the falling edge of the input logic signal HIN.

That is to say, when an H-level input logic signal HIN is inputted, the H-level input logic signal HIN is applied to the other input of the AND circuit 38 of the rising edge trigger circuit 21. At this time an H-level signal is applied to the one input of the AND circuit 38. Therefore, the AND circuit 38 outputs a set signal SET which rises at the timing of the rising edge of the input logic signal HIN.

Furthermore, the H-level input logic signal HIN is inputted to the inverter 31 and is inverted to an L-level signal. The nMOS transistor 32 is turned off by the L-level signal and the pMOS transistor 33 is turned on by the L-level signal. As a result, the capacitor 34 is charged. When a charging voltage of the capacitor 34 exceeds the potential of the reference voltage source 36, the comparator 35 outputs an H-level signal. The H-level signal is inverted by the inverter 37 to an L-level signal. Accordingly, the AND circuit 38 outputs an L-level set signal SET.

When an L-level input logic signal HIN is inputted, the L-level input logic signal HIN is applied to the other input of the AND circuit 38. As a result, an output of the AND circuit 38 becomes an L level. Furthermore, the L-level input logic signal HIN is inputted to the inverter 31 and is inverted to an H-level signal. The nMOS transistor 32 is turned on by the H-level signal and the pMOS transistor 33 is turned off by the H-level signal. As a result, the capacitor 34 is discharged. When a charging voltage of the capacitor 34 falls below the potential of the reference voltage source 36, the comparator 35 outputs an L-level signal. The L-level signal is inverted by the inverter 37 to an H-level signal. The H-level signal is applied to the one input of the AND circuit 38. However, the other input of the AND circuit 38 is at the L level. As a result, an output of the AND circuit 38 remains at the L level.

Accordingly, when an input logic signal HIN is inputted, the rising edge trigger circuit 21 outputs a set signal SET having a determined on-width which rises at the timing of the rising edge of the input logic signal HIN. When the set signal SET is transmitted via the level shift circuit 17 to the high-side drive circuit 12, the high-side drive circuit 12 outputs to the output terminal HO a signal by which the high-side power device HQ is turned on. When the high-side power device HQ is turned on, a high-side reference potential VS rises and is detected by the high-side potential detection circuit 18. A detection signal SENSE outputted by the high-side potential detection circuit 18 is inputted to the high-side potential determination circuit 19. When the detection signal SENSE proportional to the high-side reference potential VS and having a large value is inputted, the comparator 43 of the high-side potential determination circuit 19 outputs an L-level signal MPLS. The L-level signal MPLS is inputted to the event signal generation circuit 20. The event signal generation circuit 20 outputs an event signal EVENT having a determined on-width which rises at the timing of the falling edge of the signal MPLS. Even if the event signal EVENT is inputted to the pulse generation circuit 16 in this stage in which the input logic signal HIN is at an H level, an output of the AND circuit 25 does not change because an L-level signal obtained by inverting the input logic signal HIN by the inverter 22 is inputted to the one input of the AND circuit 25.

Next, when the input logic signal HIN becomes an L level, the input logic signal HIN is inverted by the inverter 22 and becomes an H-level signal. When the H-level signal is inputted to the rising edge trigger circuit 23, a reset signal RESET having a determined on-width is outputted by the operation which is the same as that of the rising edge trigger circuit 21. When the reset signal RESET is transmitted via the level shift circuit 17 to the high-side drive circuit 12, the high-side drive circuit 12 outputs to the output terminal HO a signal by which the high-side power device HQ is turned off. When the high-side power device HQ is turned off, a current flowing through the high-side power device HQ is commutated to a body diode (not illustrated) of the low-side power device LQ (when the low-side power device LQ is turned on just after that, the current comes to flow to the low-side power device LQ). As a result, the high-side reference potential VS falls. The high-side potential detection circuit 18 detects the high-side reference potential VS. When the high-side potential determination circuit 19 receives the detection signal SENSE whose value has become smaller, the high-side potential determination circuit 19 outputs an H-level signal MPLS. The H-level signal MPLS is inputted to the event signal generation circuit 20. In the event signal generation circuit 20, however, the H-level signal MPLS is merely inverted by the inverter 51 to an L-level signal and is inputted to the rising edge trigger circuit 52. Accordingly, an event signal EVENT which is an output of the rising edge trigger circuit 52 remains at an L level and does not change. Furthermore, the L-level event signal EVENT is inputted to the other input of the AND circuit 25. As a result, the AND circuit 25 outputs an L-level signal. An output signal LSTP of the rising edge trigger circuit 26 to which the L-level signal is inputted remains at an L level and an output of the inverter 27 to which the signal LSTP is inputted remains at an H level.

When the input logic signal HIN becomes the L level and an H-level input logic signal LIN is inputted after the elapse of a dead time tdt, the pulse generation circuit 16 outputs an H-level control signal LIN2 at that point of time.

A case where the high-side drive circuit 12 may go into an abnormal operating state due to noise or the like generated by turning off the high-side power device HQ at the timing at which the high-side power device HQ is turned off by inputting a reset signal RESET (reset signal RS1 in FIG. 6) will now be described. At the timing at which an L-level input logic signal HIN is inputted and the high-side reference potential VS falls, the high-side reference potential VS may rise again due to noise or the like. The reason for this is as follows. If the speed at which the high-side reference potential VS falls is too high, then the arrangement of a potential at each operating point of the high-side drive circuit 12 with the high-side reference potential VS as reference may become unstable for an instant. As a result, a false set signal SET may be generated by a slight imbalance of the high-side drive circuit 12 or noise. In this case, the high-side drive circuit 12 outputs a signal by which the high-side power device HQ is turned on again.

At this time the high-side reference potential VS is monitored by the high-side potential detection circuit 18 and the high-side potential determination circuit 19. When the high-side potential determination circuit 19 detects a fall in the high-side reference potential VS caused by inputting the L-level input logic signal HIN, the high-side potential determination circuit 19 outputs an H-level signal MPLS.

The H-level signal MPLS is inputted to the event signal generation circuit 20. The H-level signal MPLS is inverted by the inverter 51 to an L-level signal at the timing of the rising edge of the signal MPLS. As a result, there is no change in the operation of the rising edge trigger circuit 52 and an event signal EVENT remains at an L level.

If after that the high-side reference potential VS rises again as a result of the abnormal operating state of the high-side drive circuit 12, then the high-side potential determination circuit 19 outputs an L-level signal MPLS. The L-level signal MPLS is inputted to the event signal generation circuit 20. The L-level signal MPLS is inverted by the inverter 51 to an H-level signal at the timing of the falling edge of the signal MPLS. The rising edge trigger circuit 52 outputs an H-level event signal EVENT having a determined on-width at the timing of the rising edge of the signal outputted by the inverter 51.

The H-level event signal EVENT is inputted to the pulse generation circuit 16. At this time an H-level signal obtained by inverting the input logic signal HIN which is already at the L level by the inverter 22 is inputted to the one input of the AND circuit 25. Accordingly, when the H-level event signal EVENT is inputted to the other input of the AND circuit 25, the AND circuit 25 outputs an H-level signal. The H-level signal is outputted via the OR circuit 24 from the RESET terminal as a reset signal RESET (reset signal RS2 in FIG. 6). When the reset signal RESET is transmitted via the level shift circuit 17 to the high-side drive circuit 12, the high-side drive circuit 12 makes a signal at the output terminal HO an L level. Accordingly, the high-side power device HQ is reliably turned off by the reset signal RS2, though the timing at which the high-side power device HQ is turned off becomes later than when the normal operation in which the high-side power device HQ is turned off by the reset signal RS1 is performed. The reason for this is as follows. Even in the event that abnormal operation occurs again (even in the event that the high-side power device HQ is turned on again and the high-side reference potential VS returns to an H level), the sequence of "the high-side potential determination circuit 19 determines that the high-side reference potential VS returns to the H level"→"the event signal generation circuit 20 generates an event signal EVENT"→"the pulse generation circuit 16 generates a reset signal RESET again and delays the timing at which the low-side power device LQ is turned on" is repeated until the high-side power device HQ is turned off.

Furthermore, the H-level signal outputted by the AND circuit 25 of the pulse generation circuit 16 is inputted to the rising edge trigger circuit 26 and a low-side stop signal LSTP having a determined on-width is outputted from the rising edge trigger circuit 26. It is desirable to make the determined on-width equal to the dead time tdt at the time of an event signal not being generated. After the low-side stop signal LSTP is inverted by the inverter 27 to an L-level signal, the L-level signal is inputted to the one input of the AND circuit 28. Therefore, a control signal LIN2 outputted from the AND circuit 28 is at an L level. When the low-side stop signal LSTP outputted from the rising edge trigger circuit 26 becomes an L level after the elapse of the determined time, an output signal of the inverter 27 inputted to the one input of the AND circuit 28 becomes an H level. As a result, the AND circuit 28 outputs an H-level control signal LIN2. That is to say, when an event signal EVENT is generated during the dead time tdt, the control signal LIN2 is outputted after the elapse of the determined time (equal to the dead time tdt, for example) from that point of time. The control signal LIN2 is inputted to the low-side drive circuit 13. The low-side drive circuit 13 outputs from the output terminal LO a signal by which the low-side power device LQ is turned on.

With the totem-pole circuit driver having the above structure, a control signal for making the timing at which the low-side power device is turned on later than usual is generated when a high-side reference potential becomes higher than or equal to a determined voltage due to noise or the like during a dead time. Accordingly, the totem-pole circuit driver has the advantage of reliably preventing a through current from flowing.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A totem-pole circuit driver for driving a totem-pole circuit including a high-side power device and a low-side power device that are cascade-connected, the totem-pole circuit driver comprising:
    a high-side drive circuit which drives the high-side power device;
    a low-side drive circuit which drives the low-side power device;
    a pulse generation circuit which
        receives a high-side input logic signal, and generates a set signal and a reset signal respectively upon detecting a first edge and a second edge of the high-side input logic signal, the set signal and the reset signal respectively turning on and off the high-side power device, and
        receives a low-side input logic signal, and generates a control signal, which turns on and off the low-side power device, from the low-side input logic signal;
    a level shift circuit which transmits the set signal and the reset signal to the high-side drive circuit;
    a high-side potential detection circuit which detects a high-side reference potential;
    a high-side potential determination circuit which compares a value of the high-side reference potential detected by the high-side potential detection circuit and a reference voltage, and outputs a determination signal indicative of a result of the comparison; and
    an event signal generation circuit which outputs an event signal in accordance with the determination signal, wherein
    upon receipt of the event signal, and upon detecting that the high-side input logic signal instructs to turn off the high-side power device, the pulse generation circuit stops outputting the control signal used for turning on the low-side power device for a period of time.

2. The totem-pole circuit driver according to claim 1, wherein the pulse generation circuit includes:
    a first inverter which inverts the high-side input logic signal;
    a first AND circuit which performs AND on an output signal of the first inverter and the event signal;
    a rising edge trigger circuit which outputs a low-side stop signal for the period of time upon detecting a rising edge of an output signal of the first AND circuit;
    a second inverter which inverts the low-side stop signal outputted by the rising edge trigger circuit; and
    a second AND circuit which performs AND on an output signal of the second inverter and the low-side input logic signal, and outputs the control signal.

3. The totem-pole circuit driver according to claim 1, wherein upon detecting from the determination signal that the value of the high-side reference potential is greater than the reference voltage, the event signal generation circuit outputs the event signal.

4. The totem-pole circuit driver according to claim 1, wherein upon the receipt of the event signal, and upon detecting that the high-side input logic signal instructs to turn off the high-side power device, the pulse generation circuit re-generates the reset signal and outputs the re-generated reset signal.

5. The totem-pole circuit driver according to claim 1, wherein the period of time is equal to a dead time during which the event signal is not being generated.

* * * * *